United States Patent [19]

Drexhage et al.

[11] 4,051,374
[45] Sept. 27, 1977

[54] IMAGING DEVICE HAVING IMPROVED BLUE RESPONSE

[75] Inventors: Karl Heinz Drexhage, Rochester; Robert Lewis Lamberts, Penfield, both of N.Y.

[73] Assignee: Eastman Kodak Company, Rochester, N.Y.

[21] Appl. No.: 693,233

[22] Filed: June 4, 1976

[51] Int. Cl.$^2$ .............................................. G01J 1/58
[52] U.S. Cl. ................................. 250/370; 250/483; 250/486
[58] Field of Search ............... 357/30; 250/211 J, 213, 250/372, 483, 486, 366, 367

[56] References Cited

U.S. PATENT DOCUMENTS

| 2,243,828 | 5/1941 | Levereng | 250/486 |
|---|---|---|---|
| 2,828,423 | 3/1958 | Scherbatskoy | 250/370 |
| 2,924,732 | 2/1960 | Lehman | 250/486 |
| 3,427,489 | 2/1969 | Walsh | 250/372 |
| 3,484,607 | 12/1969 | McGuire | 250/458 |
| 3,546,460 | 12/1970 | Lally | 250/483 |
| 3,551,731 | 12/1970 | Harpster | 250/483 |
| 3,912,931 | 10/1975 | Gravisse | 250/372 |
| 3,932,756 | 1/1976 | Cowell et al. | 250/370 |
| Re. 22,530 | 8/1944 | Sell | 250/302 |

Primary Examiner—Harold A. Dixon
Attorney, Agent, or Firm—George E. Grosser

[57] ABSTRACT

A thin layer bearing a luminescent dye is superposed over a solid state imaging device and converts light energy, say in the blue range to longer wavelength light energy, say in the yellow-orange range. By so using a luminescent dye, the solid state imaging device's greater sensitivity at longer wavelengths is, in effect, substituted for the inferior sensitivity that typically exists for blue light, thereby upgrading the blue response of the device.

13 Claims, 8 Drawing Figures

IMAGING DEVICE HAVING IMPROVED BLUE RESPONSE

BACKGROUND OF THE INVENTION

1. Field of the Invention

The invention relates generally to solid state imaging devices and more particularly to solid state imaging devices having enhanced blue light sensitivity.

2. Description Relative to the Prior Art

Solid state imaging devices are well known, and have in the last few years aroused great interest with the advent of charge-transfer-type devices. One problem with using these charge-transfer-type devices for high quality imaging has been their low sensitivity to blue light. Such blue insensitivity typically occurs because image light passes through polysilicon electrodes before reaching the layer of the device where image representative electrical charges are formed. While polysilicon is for the most part transparent to visible light it does, unfortunately, attenuate short wavelength visible light to a large degree. In fact, polysilicon is almost opaque to violet-blue light.

Because of this undesirable blue absorption characteristic of polysilicon, substantial research efforts have been directed toward the development of a superior material for imaging device electrodes. Such efforts have met with considerable difficulties, however, as a result of stringent requirements as to, for example, transparency, compatability with adjacent layer materials, and electrical conductivity.

SUMMARY OF THE INVENTION

The present invention is concerned with a "sensitivity substitution" for upgrading the short wavelength response (especially blue response) of an imaging device: A thin layer bearing a luminescent dye is laid or coated over an imaging device (e.g., a charge-coupled imaging array) and causes light energy in a shorter wavelength range, say the blue range, to be converted to longer wavelength light energy say in the yellow-orange or red range. By so using a luminescent dye, the imager's greater sensitivity at longer wavelengths is, in effect, substituted for the inferior sensitivity at shorter wavelengths, e.g. the inferior sensitivity that typically occurs because of the attenuation by electrode material as discussed above. Hence it will be appreciated that, rather than resort to a substitute for the well known polysilicon electrode material, the invention overcomes the problem of blue attenuation in charge-coupled images by converting blue light energy over to a wavelength range which does not suffer severe attenuation in passing through polysilicon.

It is preferred to locate the dye as close as is practicable to the surface of the imager elements (often called pixels); within a thickness is one-quarter the minimum distance across an element is generally desirable as is discussed in more detail below. With the dye in such close relationship to the imager elements, the tendency of the converted light to spread in all directions is less productive of "cross talk" . . . cross talk resulting from light energy arriving in proximity to one array element and being converted and sprayed out onto other elements, thereby corrupting the image information arriving at those elements.

For a preferred implementation of the invention, a layer bearing a fluorescent dye is sandwiched between a filter mosaic and a charge-transfer type of imager (see e.g., U.S. patent application Ser. No. 555,477 filed Mar. 5, 1975). In forming a layer structure according to this implementation, it has been found important to exclude air from between the dye layer and the imager. This is because the relatively low index of refraction for air can result in a light-piping effect (internal total reflection) in the dye layer. Such light-piping produces a loss of efficiency because much of the converted light is retained in the dye layer and eventually spills out, uselessly, at an edge surface. In fact, it is desirable to coordinate the indices of refraction of (1) the image chip surface, (2) the dyed layer and (3) the filter layer in order to avoid such light-piping problems.

An important alternative for the invention calls for arranging a dye-bearing layer of the type discussed above over an imaging device to produce a black-and-white imaging device having customized sensitivity characteristics. Hence, by selectively adjusting the dye level per unit area for such a device, (and attendantly the amount by which the short wavelength response is upgraded) it is possible to regulate to a significant degree the blend sensitivities for the device among the colors of the visible spectrum. Such selective blending of sensitivities for a desired balance can be compared as to purpose with the blending of sensitivities for various types of panchromatic black-and-white photographic films albeit a different mechanism for achieving the blending is involved (see Introduction to Photographic Principles by Lewis Larmore, Dover 1965, pp. 56–51 where the spectral sensitivities of various black-and-white films are discussed).

While the invention is described with reference to the preferred use of dye materials for wavelength conversion, other means, such as Europium complexes, may be employed to effect sensitivity substitutions according to the invention. As regards the term "dye" as used herein, that term is intended to mean an organic colored material having a high absorption coefficient for a particular color.

The invention is now described in greater detail with reference to the drawings where:

Figure 1A:
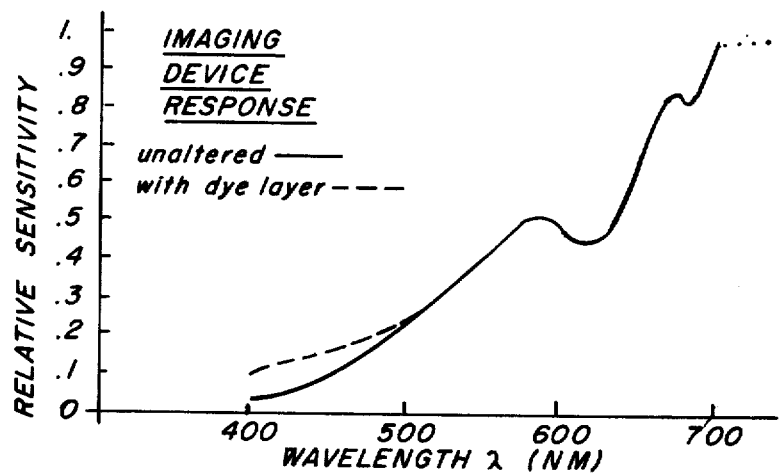
FIG. 1A is a graphic representation of imaging device spectral response.
Figure 1B:
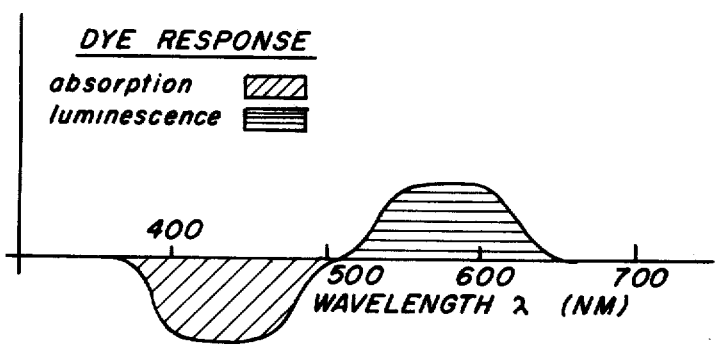
FIG. 1B is a graphical representation serving to indicate the characteristics for dye for use according to the invention.
Figure 1C:
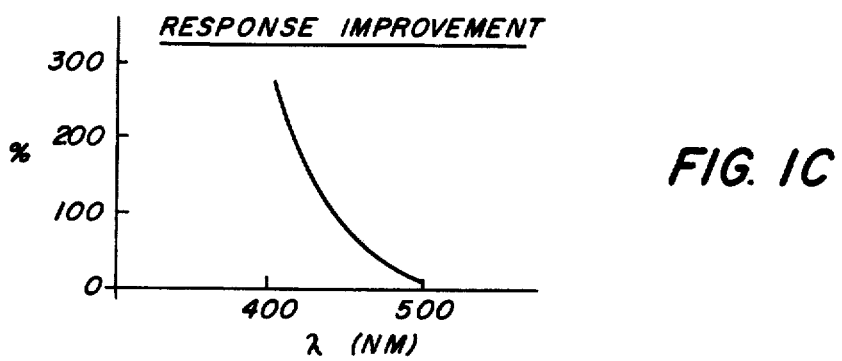
FIG. 1C is a graphical representation serving to indicate the relationship of response improvement to wavelength.

Referring to FIG. 1A there is indicated a response curve which is typical of many solid state imaging devices. This particular curve was measured on a Fairchild No. 201 charge-coupled device and evidences a substantial fall-off in sensitivity at lower visible-light wavelengths. As was mentioned above, devices according to the invention use a dye-bearing layer to "substitute" a longer wavelength sensitivity for the inferior short wavelength sensitivity inherent in the solid state imaging device . . . a type of dye response which is suitable for accomplishing this substitution is indicated in FIG. 1B. By choosing a dye or other material which is an efficient wavelength converter (more discussion on this topic follows), the overall effect of the shifting is to increase the short-wavelength response of the imaging device as is indicated by FIG. 1C. (Note: The relationships indicated are intended only to explain the underlying operating principle of the invention and specific operating characteristics will vary from imaging device to imaging device and according to the wavelength converting material used).

Figure 2:
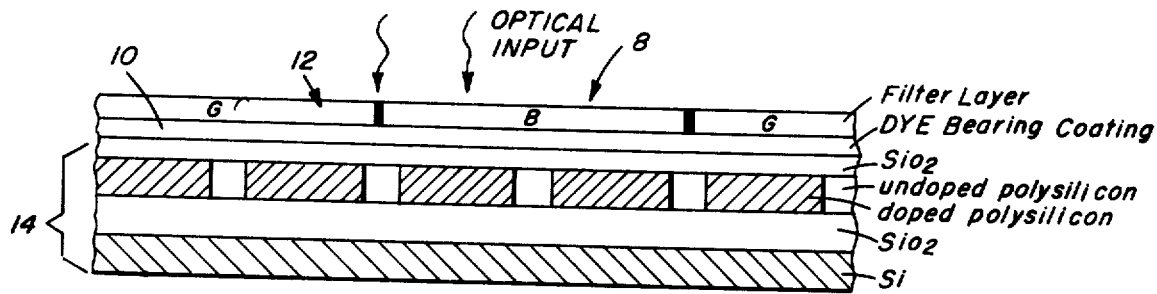
FIG. 2 is a cross-sectional view of a presently preferred imaging device according to the invention.

Now, having described generally the mechanism by which the invention improves short wavelength performance, more specific detail regarding implementation is considered: Referring to FIG. 2 a presently preferred implementation for the invention is a color imaging device which includes a dye bearing layer 10 that is sandwiched between a filter mosaic 12 and a charge-coupled imaging device 14. Individual filters of the mosaic 12 serve to selectively limit the spectral content of light arriving at corresponding individual elements of the array 14, as is well known. By adding dye layer 10, however, blue light passing through the mosaic 12 (say at a blue transmitting filter as indicated by the letter B) is converted to longer wavelength light which in turn radiates from the various dye particles and irradiates the array 14.

For such a dye layer, it is important to select a dye which (1) is efficient, i.e., produces a high ratio of luminescent light energy (i.e., either fluorescent or phosphorescent light energy) to absorbed light energy, and (2) luminesces as a wavelength for which the device 14 has a significantly higher sensitivity than for blue. Some generally suitable dyes having high conversion efficiencies include:

a. 2-(4-ethoxyphenyl)-4-(4-amyloxyphenyl)-6-phenyl-pyrylium perchlorate
b. 3-(2-benzothiazolyl)-7-diethylaminocoumarin
c. Acriflavine It should at this point be appreciated that a dye which emits light at a wavelength longer than visible wavelengths may be employed effectively according to the invention so long as the conversion is sufficiently efficient in view of the substituted sensitivity (the sensitivity at the higher wavelength) to afford an overall increase in effective blue sensitivity. Moreover, although fluorescent dyes are preferred because of their generally lesser decay time, phosphorescent dyes may also be used in luminescent layers according to the invention. Also, non-dry materials such as Europium complexes may be utilized.

Figure 3:
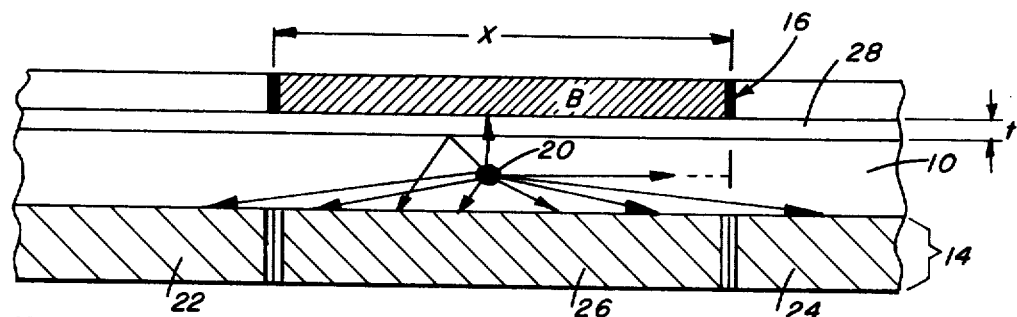
FIG. 3 is a diagram helpful in explaining the cross talk and light-piping problems that can occur with the use of layers bearing fluorescent dye.

Returning to consideration of the illumination of the array 14 by light from dye particles in layer 10, it should be noted that the converted light sprays out in all directions and hence may illuminate a non-adjacent element. This problem is indicated in the diagram of FIG. 3 where light (denoted by arrows) radiating from particle 20 irradiates non-adjacent elements 22 and 24 as well as adjacent element 26. To limit the effect of this "cross-illumination" the invention proposes to use a thin dye layer 10 preferably in a thickness range of one-tenth to one-third the minimum distance across an array element (in FIG. 3 assuming a square element the ratio $t/x$ is preferably within this range). This range tends to provide a good compromise between the elimination of cross-illumination on the one hand and the mechanical problems of achieving thin and uniform dye layers on the other.

A further effect of the tendency for light from a dye particle to spread in all directions is that a portion of the converted light is wasted (does not irradiate the corresponding element) thus reducing the efficiency of the process. While sensitivitiy gains can be achieved in spite of this waste, it is also proposed, as a refinement for the invention, to recover some of the waste light by locating a thin transparent spacer layer 28 having a relatively low index of refraction between the filter mosaic 16 and the dye layer 10. Light radiated from a dye particle and striking the interface between the layer 10 and the coating 28 at an angle will then tend to be totally reflected internally to the coating and, to be redirected onto the adjacent element 24. It should be noted, however, that this advantage is achieved only at the expense of applying an additional coating and further separating the mosaic 16 from the device 14.

A further consideration relates to the various indices of refraction of the "sandwich" and addresses, in another aspect, the light-piping or total internal reflection effect. It is, for reasons of efficiency, undesirable to have converted light reflected at the element-to-dye-layer interface; rather light sould pass through and influence the element to produce image-representative electrical charge. To minimize such undesirable reflection, the dye layer 10 should have an equal or lower index of refraction than the adjacent element face (generally silicon dioxide with an index of 1.45). Poly(trifluoroethyl methacrylate) (index 1.44) is one possibility as a medium for the dye. As mentioned above, if air (index 1.0) is present between the face of the semiconductor material and the dye-bearing layer, light-piping at the layer interface with the air will tend to occur. Since such reflected light is likely to be wasted it is preferable in applying the dye layer, that no voids or separations be permitted between the dye layer and the semiconductor imaging device. Such a condition is achieved in accordance with this implementation by applying the dye layer as a liquid coating of sufficiently low viscosity to eliminate air pockets.

Figure 4:
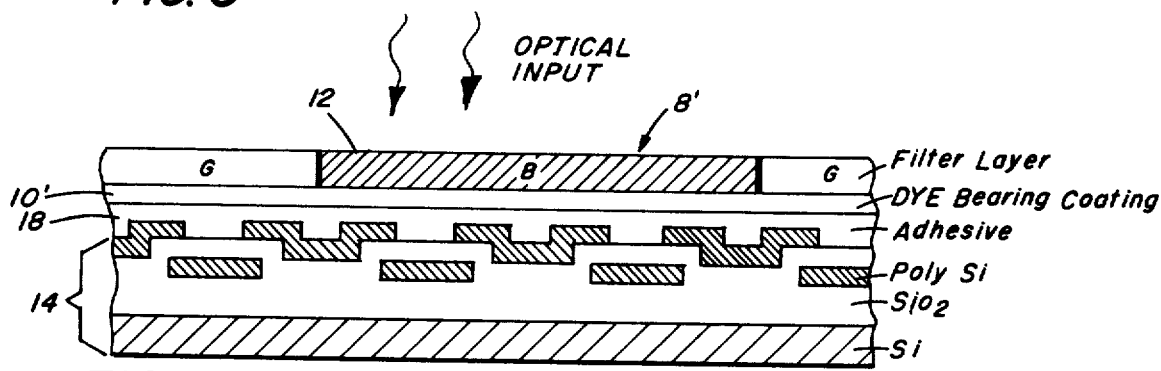
FIG. 4 is a cros-sectional representation of an alternative implementation for the invention.

Referring to FIG. 4 an alternative for the invention utilizes fluorescent dye which is present in a film layer 10'. An adhesive 18 is used between the film layer 10' and the solid state imaging device 14 which adhesive excludes air from the interface and serves to match the film layer refractive index to that of the imaging device i.e., the refractive index of the adhesive must be greater than or equal to that of the film layer and that of the device. By so eliminating any voids between layers with an "index matched" material, light-piping effects are for the most part eliminated. Considerations regarding the ratio of layer thickness to the maximum distance across a semiconductor device element continue to be important for the reasons stated above with respect to the implementation of FIG. 3, however, the thickness of the adhesive layer should be included as is a part of the dye layer thickness.

Figure 5:
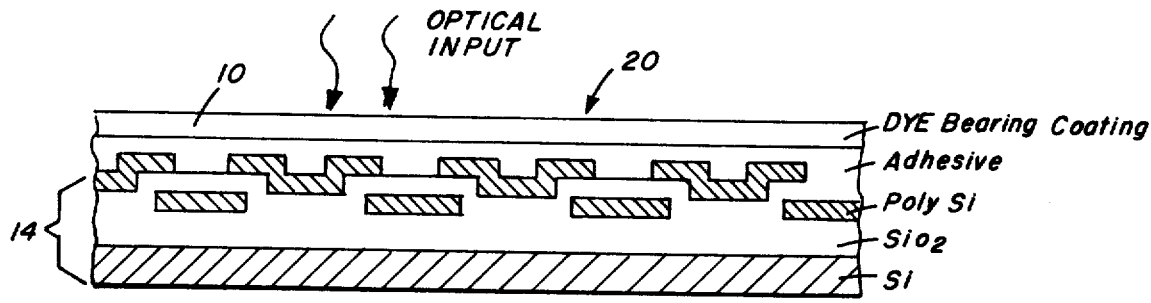
FIG. 5 is a cross sectional representation of an alternative for implementing the invention in a black-and-white imaging device.
Figure 6:
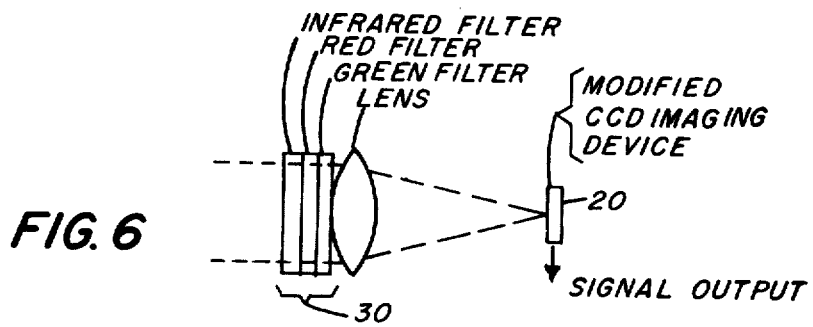
FIG. 6 is a diagram helpful in teaching a refinement of the implementation of FIG. 5.

Referring to FIG. 5, a further alternative implementation of the invention comprises an imaging device 14 with a dye-bearing layer 10 superposed thereon. (An adhesive layer 18 is employed for index matching as discussed above with respect to the implementation of FIG. 3.) Such an arrangement is suitable for black-andwhite imaging and permits selective adjustment of the relative response for blue light. Such adjustment is achieved by adjusting the dye density in the layer 10 and attendantly the degree to which blue response is upgraded. This control over relative blue response can be complemented by attenuation filters 30 for green and/or red (see FIG. 6) to permit adjustment of the overall panchromatic sensitivity characteristic of the composite imaging system.

The invention has been described in detail, however it will be appreciated that modifications and variations can be effected within the spirit and scope of the invention: For example, any imaging device characterized by inferior response for short wavelength light as compared to the response at some longer wavelength range may benefit from modifiction according to the invention. Further, a variety of dyes may be utilized to effect sensitivity substitution according to the invention and such dyes may be of either the fluorescent or the phosphorescent type. Also, materials other than dye, which produce a wavelength conversion, such as Europium complexes, may serve as means for effecting such sensitivity substitutions. Still further various layer media may be used to match the indices of refraction of the several layers transmitting image light according to the invention.

What is claimed:

1. In a silicon imaging device of the type adapted to convert a visible light image directed into a face thereof to electrical signal form and having a sensitivity characteristic that generally increases with wavelength over the visible spectral range, the improvement comprising:
a dye-bearing layer superposed over said face, the dye thereof being of a type that fluoresces by absorbing short wavelength visible light and in response thereto emits longer wavelength visible light which is within the operative range of said imaging device, said layer being substantially transparent to green and red light whereby short visible wavelength response is effectively upgraded without degrading green or red response.

2. In a charge-transfer imaging device for conveying a visible light image directed onto a face thereof to an electrical signal form, which device includes a polysilicon electrode structure that influences the device sensitivity to be higher in a longer-than blue wavelength range than in the blue wavelength range, the improvement comprising:
a layer superposed over said face, such layer including a material that a) absorbs light of the blue wavelength range and b) responsively emits light within such longer-than-blue wavelength range, whereby the blue response of the device is effectively upgraded.

3. A color imaging device comprising:
a semiconductor imaging device having respective light sensitive elements and being adapted to be illuminated by image light at a first face thereof, said semiconductor imaging device having a polysilicon electrode structure on said first face whereby short wavelength visible light response is sharply attenuated;
a dye-bearing layer superposed over said first face of said imaging device, the dye in said layer being of a type which absorbs light at short wavelengths of the visible spectrum and responsively emits light at a longer-wavelength range to which said semiconductor imaging device is responsive, and said layer being substantially transparent to longer wavelength visible light; and a mosaic of filter elements superposed on said dye layer such elements being in one-to-one registration with the elements of said semiconductor imaging device to selectively limit the visible light components arriving at the respective device elements.

4. A color imaging device according to claim 3 wherein the face of said imaging device has a characteristic index of refraction and said dye-bearing layer has an index of refraction which is equal to or lower than that for said semiconductor imaging device.

5. A color imaging device according to claim 4 wherein said imaging device face is essentially a silicon material and said dye bearing layer is Acriflavine dye in a medium of poly(trifluoroethyl methacrylate).

6. A color imaging device according to claim 4 wherein a transparent layer is sandwiched between said filter element mosaic and said dye-bearing layer and has a significantly lower index of refraction than said dye-bearing layer.

7. A color imaging device according to claim 3 wherein (1) the face of said imaging device has a characteristic index of refraction, (2) the dye-bearing layer is a film layer having an index of refraction which is less than that for said semiconductor imaging device and (3) an adhesive layer fills the space between said dye layer and said semiconductor imaging device has an index of refraction which is equal to or greater than the index of refraction for said dye-bearing layer.

8. A color imaging device according to claim 3 wherein the thickness of said dye-bearing layer is within a range of one-tenth to one-quarter the minimum distance across an individual element of said semiconductor imaging device.

9. A panchromatic imaging device for visible light images comprising:
a solid-state imaging device having respective light sensitive elements and being adapted to be illuminated by visible light at a first face thereof, said element having a sensitivity characteristic which generally increases with wavelength at least over the visible wavelength range,
and a layer superposed over the image receiving face of said solid-state device that includes a material which absorbs short wavelength visible light and in response emits longer wavelength light within the operative range of said solid state imaging device whereby increased short wavelength response is achieved, said layer being substantially transparent to green and red light whereby the full visible spectrum influences the device output.

10. A panchromatic imaging device according to claim 9 wherein said material is a dye that absorbs blue light and the density of the dye is selectively adjusted to achieve a desired balance between blue response and the response over the rest of the visible spectrum.

11. A panchromatic imaging device according to claim 10 wherein said solid-state imaging device is a silicon charge-transfer-type imaging device having polysilicon electrodes on said first face.

12. A panchromatic imaging device according to claim 11 wherein said semiconductor imaging device is a charge-coupled device and the dye-bearing layer is comprised of the dye 3-(2-benzothiazoyl)-7-diethylaminocoumarin in a medium of cellulose acetate.

13. A panchromatic imaging device according to claim 12 wherein said layer has a thickness proportioned in relation to the smallest detail resolvable by said imaging device.

* * * * *